(12) United States Patent
Baek

(10) Patent No.: US 8,853,018 B2
(45) Date of Patent: Oct. 7, 2014

(54) METHOD OF MANUFACTURING SEMICONDUCTOR DEVICE HAVING MULTI-CHANNELS

(71) Applicant: SK hynix Inc., Icheon (KR)

(72) Inventor: Seung Joo Baek, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/722,852

(22) Filed: Dec. 20, 2012

(65) Prior Publication Data

US 2013/0309825 A1  Nov. 21, 2013

(30) Foreign Application Priority Data

May 17, 2012  (KR) .................. 10-2012-0052244

(51) Int. Cl.
  *H01L 21/336* (2006.01)
  *H01L 29/66* (2006.01)
(52) U.S. Cl.
  CPC .............................. *H01L 29/66484* (2013.01)
  USPC ................... 438/176; 438/283; 257/E21.623

(58) Field of Classification Search
  CPC ............ H01L 29/66795; H01L 29/785; H01L 21/823842
  USPC ................. 438/157, 176, 283; 257/E21.623, 257/E21.637
  See application file for complete search history.

(56) References Cited

U.S. PATENT DOCUMENTS

2006/0105529 A1*  5/2006  Lee ............................... 438/283

FOREIGN PATENT DOCUMENTS

KR              100139573 B1    4/1998
KR        10-2006-0054667 A     5/2006

* cited by examiner

*Primary Examiner* — Thanhha Pham

(57) ABSTRACT

A method for manufacturing a semiconductor device having multi-channels is provided. The method includes etching an active region of a gate region and a device isolation layer of the gate to form a gate recess, forming a first gate buried in a lower portion of the gate recess, forming an active bridge on the first gate for connecting portions of the active region at both sides of the first gate, and forming a second gate on the first gate to cover the active bridge. Therefore, a multi-channel region can be formed.

19 Claims, 12 Drawing Sheets

(a)

(b)

(a)

(b)

(a)

(b)

(a)

(b)

(a)

(b)

(a)

(b)

METHOD OF MANUFACTURING SEMICONDUCTOR DEVICE HAVING MULTI-CHANNELS

CROSS-REFERENCE TO RELATED APPLICATION

The present application claims priority to Korean patent application number 10-2012-0052244, filed on 17 May 2012, which is incorporated by reference herein in its entirety.

BACKGROUND

Embodiments relate to a method of manufacturing a semiconductor device, and more particularly, to a method of manufacturing a semiconductor device having multi-channels.

As semiconductor devices are highly integrated, a device formation region (active region) is reduced in a size and thus a transistor formed in the active region is reduced in a channel length.

As the channel length of the transistor is reduced, a short channel effect, in which a source and drain affects a potential or electric field in a channel region is considerable, is caused. Further, with reduction in the active region, an external resistance and channel resistance of the cell transistor are increased to reduce operation speed and a channel width, so that a threshold voltage is reduced.

Therefore, various methods for reducing a size of a device to be formed in a substrate, while maximizing performance of the device, have been studied. These may typically be fin type semiconductor devices.

In the fin type semiconductor devices, current flows through a recess channel and a fin channel to increase current drivability.

However, with miniaturization of below 30 nm in semiconductor technology, even in the pin structure of the related art, the channel resistance is increased to degrade current drivability.

SUMMARY

One or more exemplary embodiments are provided to a method for manufacturing a semiconductor device having a multi-channel region by forming a fin type channel region below a channel and a channel region buried in the gate to maximize current drivability.

One or more exemplary embodiments are provided to a method for manufacturing a semiconductor device having multi-channels by forming an active bridge, in which a multi-channel region is formed, through silicon deposition or growth without etching of a silicon substrate.

According to an exemplary embodiment, there is provided a method of manufacturing a semiconductor device having multi-channels. The method may include: etching an active region of a gate region and a device isolation layer of the gate region to form a gate recess; forming a first gate buried in a lower portion of the gate recess; forming over the first gate, an active bridge for connecting portions of the active region at both sides of the first gate; and forming a second gate formed over the first gate to cover the active bridge.

The forming of a gate recess may include etching the device isolation layer deeper than the active region, so that the active region protrudes beyond the device isolation layer.

The method may further include forming a first gate insulating layer over a surface of the active region exposed by the gate recess before forming the first gate.

The method may further include forming the second gate insulating layer over the first gate where the active bridge is to be formed before forming the active bridge.

The forming a second gate insulating layer may include providing a gate insulating layer material on an upper surface of a region of the first gate overlapping the active region.

The implanting of a gate insulating layer material may include sputtering a silicon oxide layer material.

The forming of an active bridge may include providing silicon (Si) on an upper surface of a region of the first gate overlapping the active region.

The forming of an active bridge may include growing silicon (Si) using the active region as a seed.

The method may further include forming a third gate insulating layer over an upper surface of the active bridge before forming the second gate.

The method may further include implanting an impurity for adjusting a threshold voltage into the active bridge.

The implanting an impurity for adjusting a threshold voltage may include implanting boron or $BF_2$.

According to another aspect of an exemplary embodiment, there is provided a method of manufacturing a semiconductor device having multi-channels. The method may include: forming a gate recess by etching an active region of a gate region to a first depth and etching a device isolation region of the gate region to a second depth; forming a first gate in a lower portion of the recess; forming an active bridge over a region of the first gate overlapping the active region; and forming a second gate on the first gate to cover the active bridge.

According to the exemplary embodiment, in addition a fin type channel region formed below the gate, a channel region buried in a gate is additionally formed to fabricate the semiconductor device having a multi-channel region so that current drivability of the device can be maximized.

Further, the active bridge, in which the multi-channel region is formed, is formed through silicon deposition or growth without etching of a silicon substrate to fabricate a semiconductor device having a multi-channel easily.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 3(a) to 10(b) are cross-sectional views illustrating a method of fabricating the semiconductor device of FIGS. 2(a)-(b)

DETAILED DESCRIPTION

Figure 1:
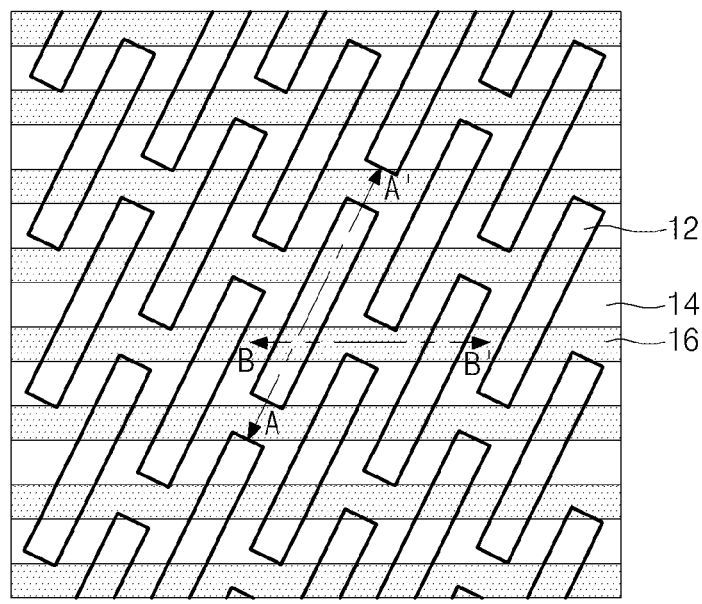
FIG. 1 is a layout view illustrating a $6F^2$ structure to which a semiconductor device according to exemplary embodiments is applied.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2:
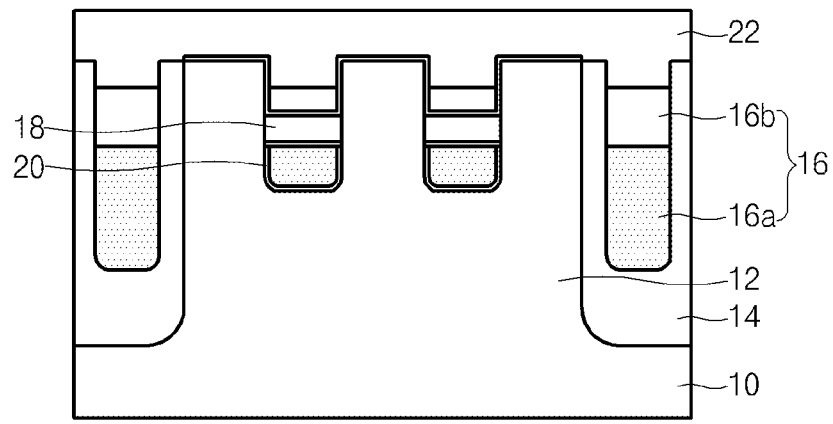
FIGS. 2(a)-(b) is a cross-sectional view illustrating a semiconductor device according to a first exemplary embodiment.
Figure 2:
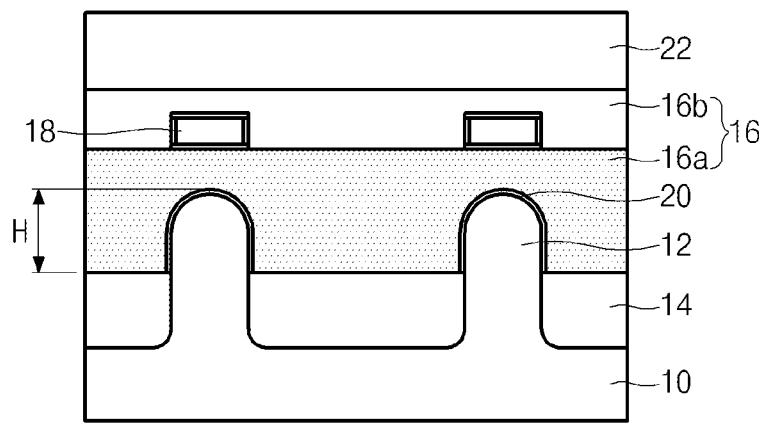
Figure 3:
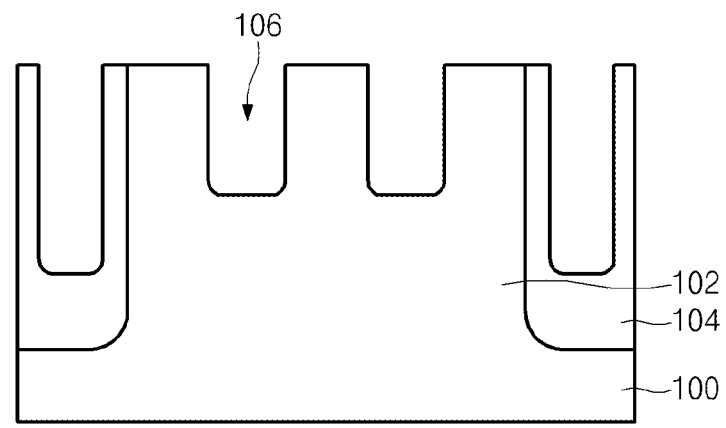
Figure 3:
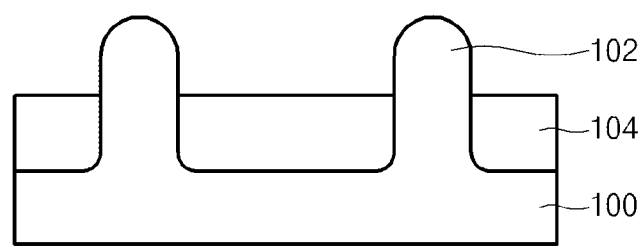
Figure 4:
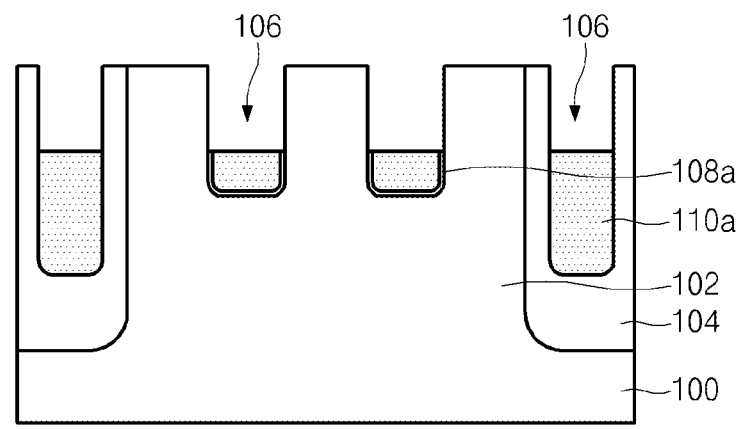
Figure 4:
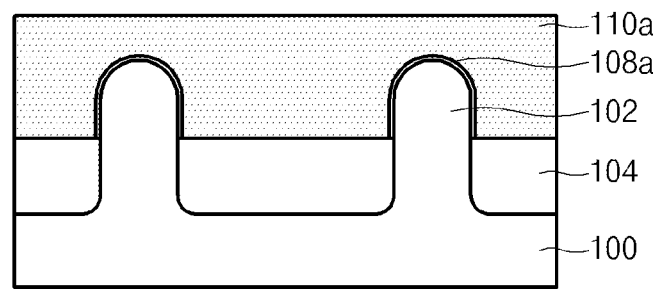
Figure 5:
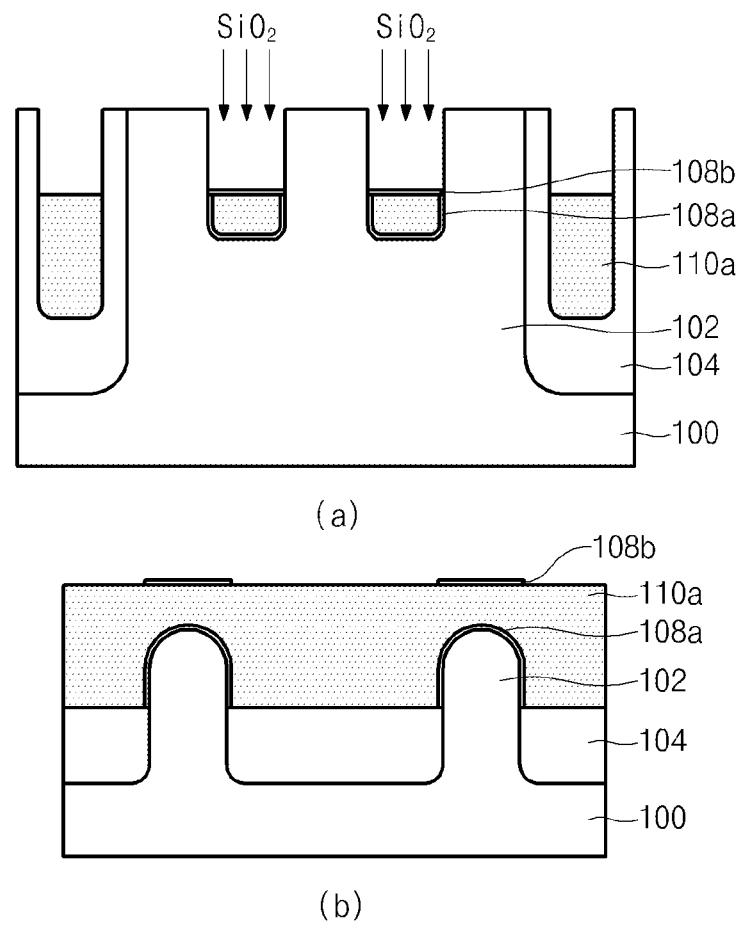
Figure 6:
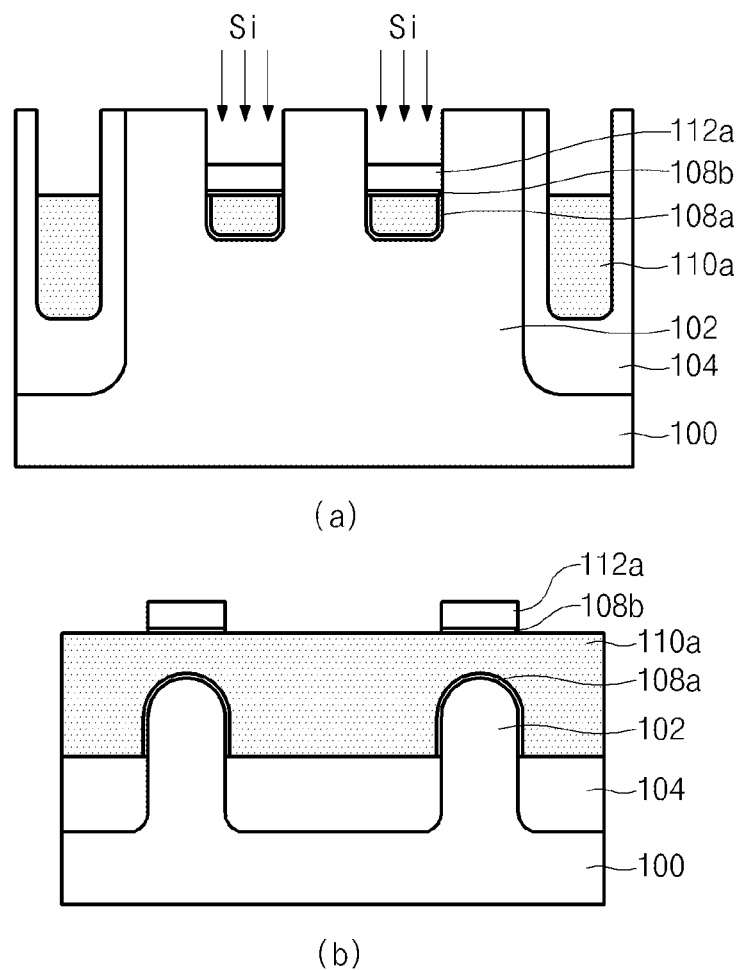
Figure 7:
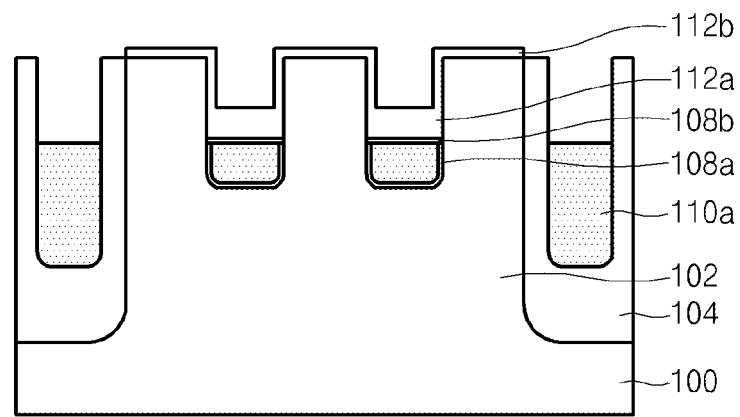
Figure 7:
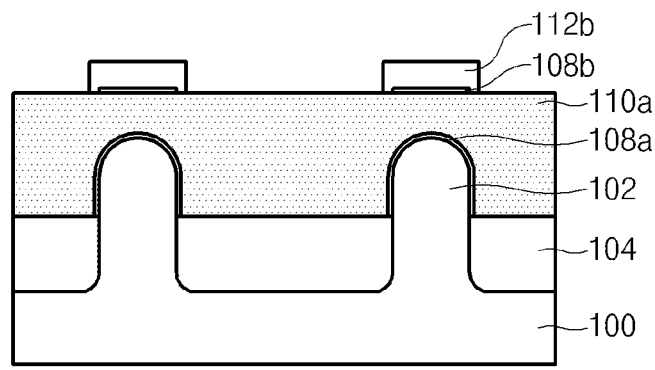
Figure 8:
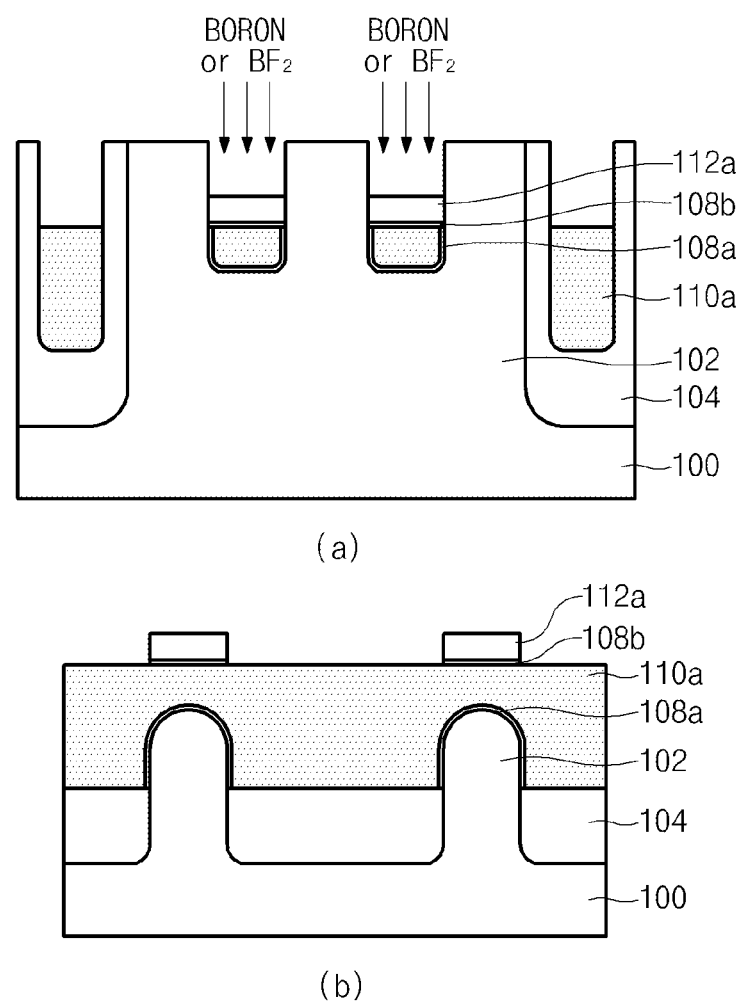
Figure 9:
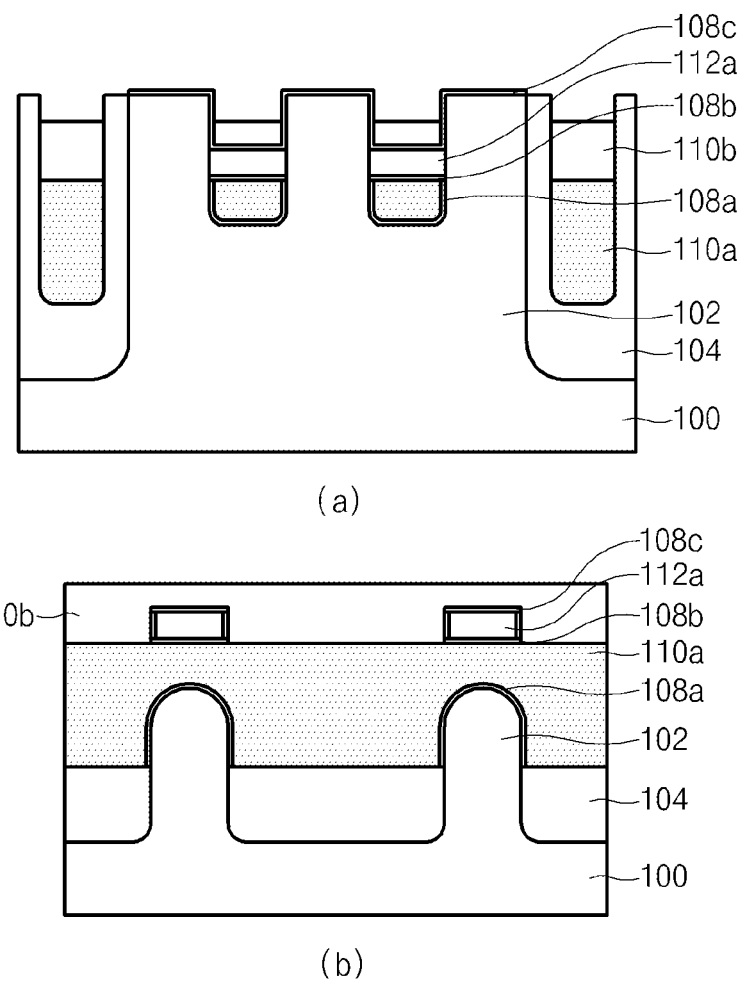
Figure 10:
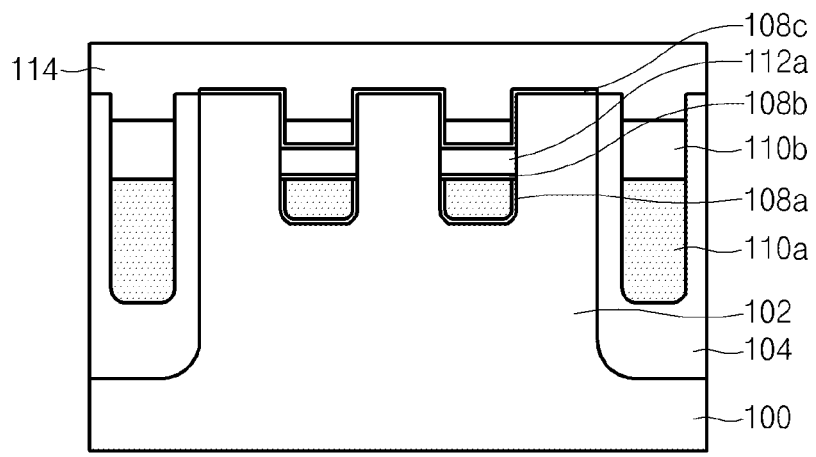
Figure 10:
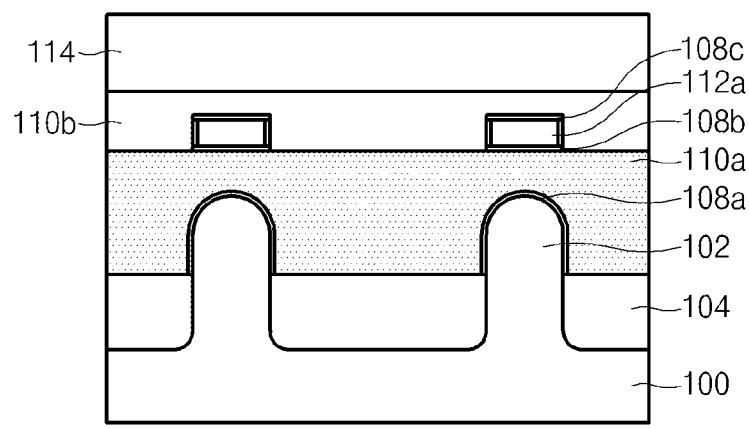

FIG. 1 is a layout view illustrating a $6F^2$ structure to which a semiconductor device according to an exemplary embodiment can be applied. FIGS. 2(a)-(b) are cross-sectional views illustrating a semiconductor device according to an exemplary embodiment. FIG. 2(a) shows a cross-sectional view taken along line A-A' of FIG. 1 and FIG. 2(b) shows a cross-sectional view taken along line B-B' of FIG. 1.

Referring to FIGS. 1 and 2(a)-(b), an active region 12 defined by a device isolation layer 14 is disposed to obliquely cross gates 16. The gates 16 are buried gates buried in the active region 12 and the device isolation layer 14.

A gate recess, in which the active region 12 is etched to a fixed depth, is formed in a gate formation region of the active region 12. A gate channel, which passes through the active region 12, is formed in a lower portion of the gate recess in a direction to which the gate extends. That is, an active bridge 18 which is surrounded by the buried gate 16 to form a multi-channel region, is formed between the gate recess and the gate tunnel. The active bridge 18 may be formed by implanting silicon (Si) into an upper portion of a lower buried gate 16a. Alternatively, the active bridge may be formed of a growth layer grown using a silicon substrate of the active region as a seed.

The buried gate 16 includes the lower buried gate 16a formed below the active bridge 18 to be buried in the gate tunnel, and an upper buried gate 16b formed on the lower buried gate 16a to cover the active bridge 18. That is, the active bridge 18 is surrounded by the lower buried gate 16a and the upper buried gate 16b.

Further, the active region 12 below the gate tunnel is formed to have a fin structure which protrudes by a fixed height H beyond the device isolation layer 14. That is, the lower buried gate 16a has a fin gate structure.

A gate insulating layer 20 is formed between the buried gate 16 and the active region 12 and an insulating layer 22 is formed on the buried gate 16. At this time, the gate insulating layer 20 is formed of a silicon oxide ($SiO_2$) layer. The insulating layer 22 is not illustrated in FIG. 1 for clarity.

FIGS. 3(a) to 10(b) are views illustrating a method of manufacturing the semiconductor device of FIGS. 2(a)-(b). In the figures, the view (a) shows a cross-sectional view corresponding to FIG. 2(a) and the view (b) shows a cross-sectional view corresponding to FIG. 2(b).

Referring to FIGS. 3(a)-(b), a semiconductor substrate 100 of a device isolation region is etched to a fixed depth using a shallow trench isolation (STI) process to form a trench (not shown). An insulating layer is formed to be buried within the trench to form a device isolation layer 104 defining an active region 102. The device isolation layer 104 may be formed by a single gap-fill process using a flowable oxide. Alternatively, the device isolation layer 104 may be formed in structure in which a flowable oxide layer and a deposition oxide layer are combined (for example, stacked). The flowable oxide may include a spin on dielectric (SOD) layer and the deposition oxide layer may include a high density plasma (HDP) oxide layer. Before the device isolation layer 104 is formed, a sidewall oxide layer (not shown) may be formed on an inner surface of the trench through a wall oxidation process and a liner nitride layer (not shown) may be formed on the sidewall oxide layer.

A hard mask layer (not shown) is formed on the active region 102 and the device isolation layer 104 is formed and a photoresist pattern (not shown) defining a gate region is formed on the hard mask layer through a general photo etching process. The hard mask layer may include an oxide layer and/or a nitride layer.

Next, the hard mask layer is etched using the photoresist pattern as an etch mask to form a hard mask pattern (not shown), and the active region 102 and the device isolation layer 104 are etched using the hard mask pattern as an etch mask to form a gate recess 106. The gate recess 106 is formed deeper in the device isolation layer 104 than in the active region 102 using etch selectivity between the active region 102 and the device isolation layer 104, so that the recessed active region 102 protrudes in a pin type.

Referring to FIGS. 4(a)-(b), a gate insulating layer 108a is formed a surface of the active region 102 exposed by the gate recess 106. The gate insulating layer 108a includes a silicon oxide ($SiO_2$) layer. The gate insulating layer 108a may be formed by depositing a silicon oxide layer on the exposed active region. Alternatively, the gate insulating layer 108a may be formed of an oxide layer formed on a surface of the active region 102 by performing an annealing process on the active region 102.

Next, a conductive material for a gate is formed to be buried within the gate recess 106. The conductive material for a gate may include metal such as tungsten (W). Before tungsten (W) for a gate is buried within the gate recess 106, a barrier metal such as titanium/titanium nitride (Ti/TiN) may be formed on the inner surface of the gate recess 106.

Subsequently, an etchback process is performed on the conductive material to form a lower buried gate 110a buried in a lower portion of the recess gate 106. Since the lower buried gate 110a is formed in a fin type in which the active region 102 etched by the gate recess protrudes rather than the device isolation layer 104, the lower buried gate 110a has a fin gate structure surrounding the protruding active region 102.

The etch back process is performed so that the gate insulating layer 108a does not remain on a sidewall of the gate recess on the lower buried gate 110a.

Referring to FIGS. 5(a)-(b), a gate insulating layer material, for example, a silicon oxide layer material is provided on the lower buried gate 110a overlapping the active region 102. That is, the silicon oxide layer material is sputtered onto the lower buried gate 110a of a region in which an active bridge is to be formed in a subsequent process to form a gate insulating material 108b.

Figure 11A:
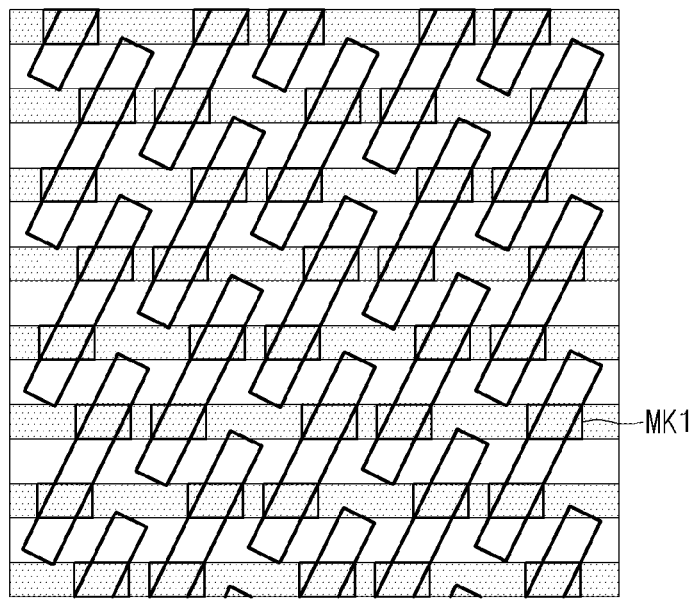
FIGS. 11A to 11C are views illustrating sputtering masks for a gate insulating layer material or silicon.
Figure 11B:
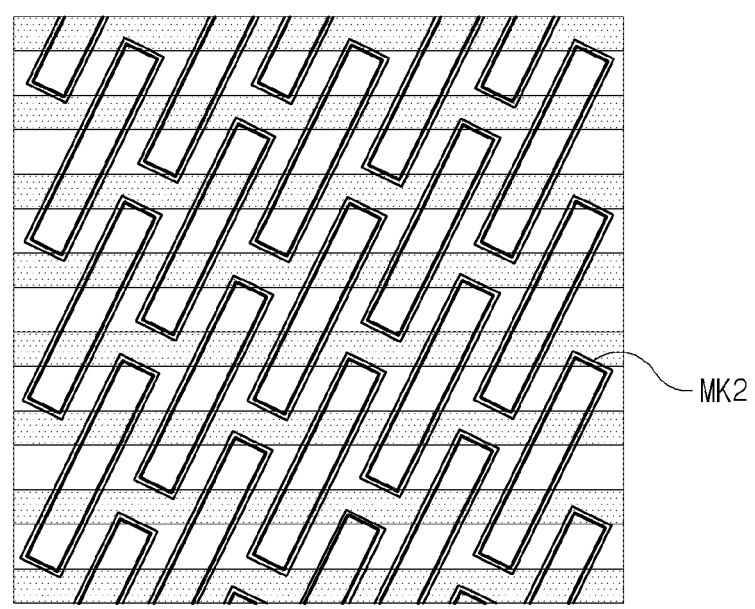
Figure 11C:
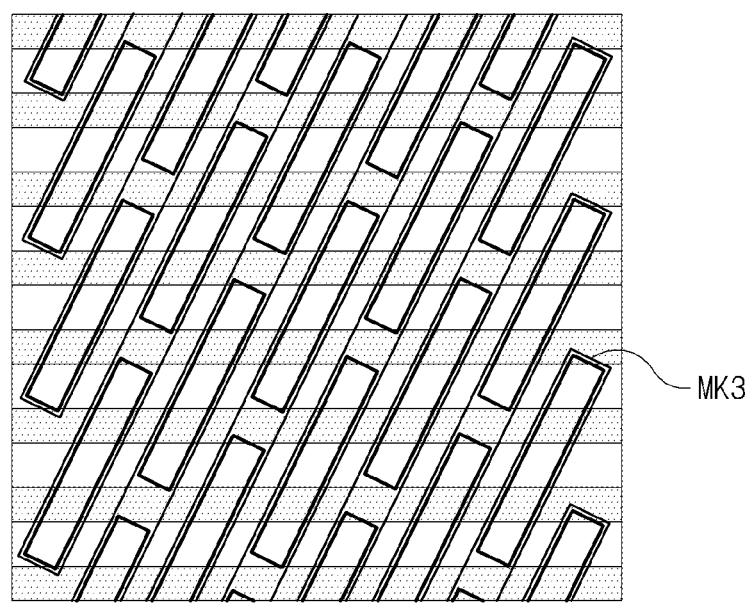

The silicon oxide layer material is deposited, e.g., sputtered, using a mask as shown in FIGS. 11A to 11C to selectively form the gate insulating layer 108b on the lower buried gate 110a. That is, the gate insulating layer 108b may be selectively formed on the lower buried gate 110a using a mask defining a region MK1 of the lower buried gate 110a overlapping the active region 102 as a box type as shown in FIG. 11A, a mask defining a region MK2 corresponding to each of the active regions 102 as shown in FIG. 11B, or a mask defining a line-shaped region MK3 extending a longitudinal direction of the active region 102 as shown in FIG. 11C.

Referring to FIGS. 6(a)-(b), silicon (Si) is sputtered on the gate insulating layer 108b using the mask as shown in FIGS. 11A to 11C to form an active bridge 112a connecting portions of the active region at both sides of the lower buried gate 110a. Alternatively, as shown in FIGS. 7(a)-(b), silicon (Si) may be grown using the exposed active region 102 as a seed to form an active bridge 112b on the gate insulating layer 108b.

Subsequent processes after the active bridge 112a illustrated in FIGS. 6(a)-(b), are the same subsequent processes after the active bridge 112b illustrated in FIGS. 7(a)-(b). For clarity, the case in which the active bridge is formed using the mask as shown in FIGS. 6(a)-(b) is illustratively described.

Referring to FIGS. 8(a)-(b), boron or $BF_2$ ions are implanted into the active bridge 112a using the mask of FIGS. 11A to 11C. Boron or $BF_2$ ions are implanted into the active bridge 112a to adjust a threshold voltage of a channel region to be formed in the active bridge 112a.

Referring to FIGS. 9(a)-(b), a gate insulating layer 108c is formed on the active region 102 and the active bridge 112a. At this time, the gate insulating layer 108c may be formed by depositing an oxide layer on exposed active region 102 and active bridge 112a, or may be formed of an oxide layer on the surfaces of the active region 102 and the active bridge 112a by performing an annealing process on the active region 102 and active bridge 112a.

Next, a conductive material for a gate is formed on the buried gate insulating layer 108c and the lower buried gate 110a to be buried within the gate recess. Subsequently, the conductive material for a gate is etched back to form an upper buried gate 110b covering the active bridge 112a and the lower buried gate 110a. Therefore, the active bridge 112a is surrounded by the lower buried gate 110a and the upper buried gate 110b. That is, the active bridge 112a becomes a dual channel region in which channels are formed by the lower buried gate 110a and the upper buried gate 110b. A channel region is formed in the active region below the lower buried gate 110a by the lower buried gate 110a.

At this time, the lower buried gate 110a may include the same material as the upper buried gate 110b or a different material from the upper buried gate 110b.

Referring to FIGS. 10(a)-(b), an insulating layer 114 is formed on the upper buried gate 110b to be buried within the gate recess. At this time, the insulating layer 114 may be formed of a nitride layer.

The above embodiment is illustrative and not limiting. Various alternatives and equivalents are possible. Embodiments are not limited to any specific type of semiconductor device. Other additions, subtractions, or modifications are intended to fall within the scope of the appended claims.

What is claimed is:

1. A method of manufacturing a semiconductor device having a multi-channel, the method comprising:
    etching an active region of a gate region and a device isolation layer of the gate region to form a gate recess;
    forming a first gate buried in a lower portion of the gate recess;
    forming an active bridge over the first gate for connecting portions of the active region at sides of the first gate, after forming the first gate; and
    forming a second gate over the first gate to cover the active bridge, after forming the active bridge.

2. The method of claim 1, wherein forming a gate recess includes etching the device isolation layer deeper than the active region, so that the active region protrudes beyond the device isolation layer.

3. The method of claim 1, further comprising forming a first gate insulating layer over a surface of the active region exposed by the gate recess, before forming the first gate.

4. The method of claim 1, further comprising forming a second gate insulating layer over the first gate where the active bridge is to be formed, before forming the active bridge.

5. The method of claim 4, wherein forming a second gate insulating layer includes providing a gate insulating layer material on an upper surface of a region of the first gate overlapping the active region.

6. The method of claim 5, wherein providing the gate insulating layer material includes sputtering a silicon oxide layer material.

7. The method of claim 1, wherein forming the active bridge includes providing silicon (Si) on an upper surface of a region of the first gate overlapping the active region.

8. The method of claim 7, further comprising forming a third gate insulating layer over an upper surface of the active bridge, before forming the second gate.

9. The method of claim 7, further comprising implanting an impurity for adjusting a threshold voltage into the active bridge.

10. The method of claim 9, wherein implanting the impurity for adjusting a threshold voltage may include implanting boron or $BF_2$.

11. The method of claim 1, wherein forming the active bridge includes growing silicon (Si) using the active region as a seed.

12. The method of claim 11, further comprising forming a third gate insulating layer on an upper surface of the active bridge, before forming the second gate.

13. The method of claim 11, further comprising implanting an impurity for adjusting a threshold voltage into the active bridge.

14. A method of manufacturing a semiconductor device having multi-channels, the method comprising:
    forming a gate recess by etching an active region of a gate region to a first depth and etching a device isolation region of the gate region to a second depth;
    forming a first gate in a lower portion of the gate recess;
    forming an active bridge over a region of the first gate overlapping the active region, after forming the first gate; and
    forming a second gate on the first gate to cover the active bridge, after forming the active bridge.

15. The method of claim 14, further comprising forming a first insulating layer on a surface of the active region exposed by the gate recess before the forming a first gate.

16. The method of claim 14, further comprising forming a second gate insulating layer on the first gate where the active bridge is to be formed, before forming the active bridge.

17. The method of claim 14, wherein forming the active bridge includes providing silicon (Si) over an upper portion of a region of the first gate overlapping the active region.

18. The method of claim 17, further comprising forming a third gate insulating layer on the active bridge, before forming the second gate.

19. The method of claim 14, wherein forming the active bridge includes growing silicon (Si) using the active region as a seed.

* * * * *